United States Patent

Kanomata et al.

[11] Patent Number: 5,263,630
[45] Date of Patent: Nov. 23, 1993

[54] BONDING APPARATUS

[75] Inventors: Tsuneo Kanomata; Sadami Yakuwa, both of Yamagata, Japan

[73] Assignee: NEC Corporation, Tokyo, Japan

[21] Appl. No.: 923,489

[22] Filed: Aug. 3, 1992

[30] Foreign Application Priority Data

Aug. 2, 1991 [JP] Japan .................................. 3-193351

[51] Int. Cl.$^5$ ............................................. B23K 20/10
[52] U.S. Cl. ................................................... 228/1.1
[58] Field of Search ......................................... 228/1.1

[56] References Cited

U.S. PATENT DOCUMENTS

| | | | |
|---|---|---|---|
| 3,670,944 | 6/1972 | Dushkes et al. | 228/1.1 |
| 3,794,236 | 2/1974 | Salzer et al. | 228/1.1 |
| 4,571,688 | 2/1986 | Kashihara et al. | 228/1.1 X |
| 4,808,948 | 2/1989 | Patel et al. | 228/4.5 |
| 4,854,494 | 8/1989 | von Raben | 228/1.1 X |
| 4,959,895 | 10/1990 | Sager | 228/1.1 X |

FOREIGN PATENT DOCUMENTS 171144  8/1986  Japan .................................. 228/1.1

Primary Examiner—Kenneth J. Ramsey
Attorney, Agent, or Firm—Burns, Doane, Swecker & Mathis

[57] ABSTRACT

In order to vibrate a capillary stably at an arbitrary frequency with an arbitrary waveform, a bonding apparatus having a piezoelectric element vibrating stably at an arbitrary frequency with an arbitrary waveform in response to an input of a piezoelectric element control signal from a piezoelectric element control signal generator is provided.

3 Claims, 3 Drawing Sheets

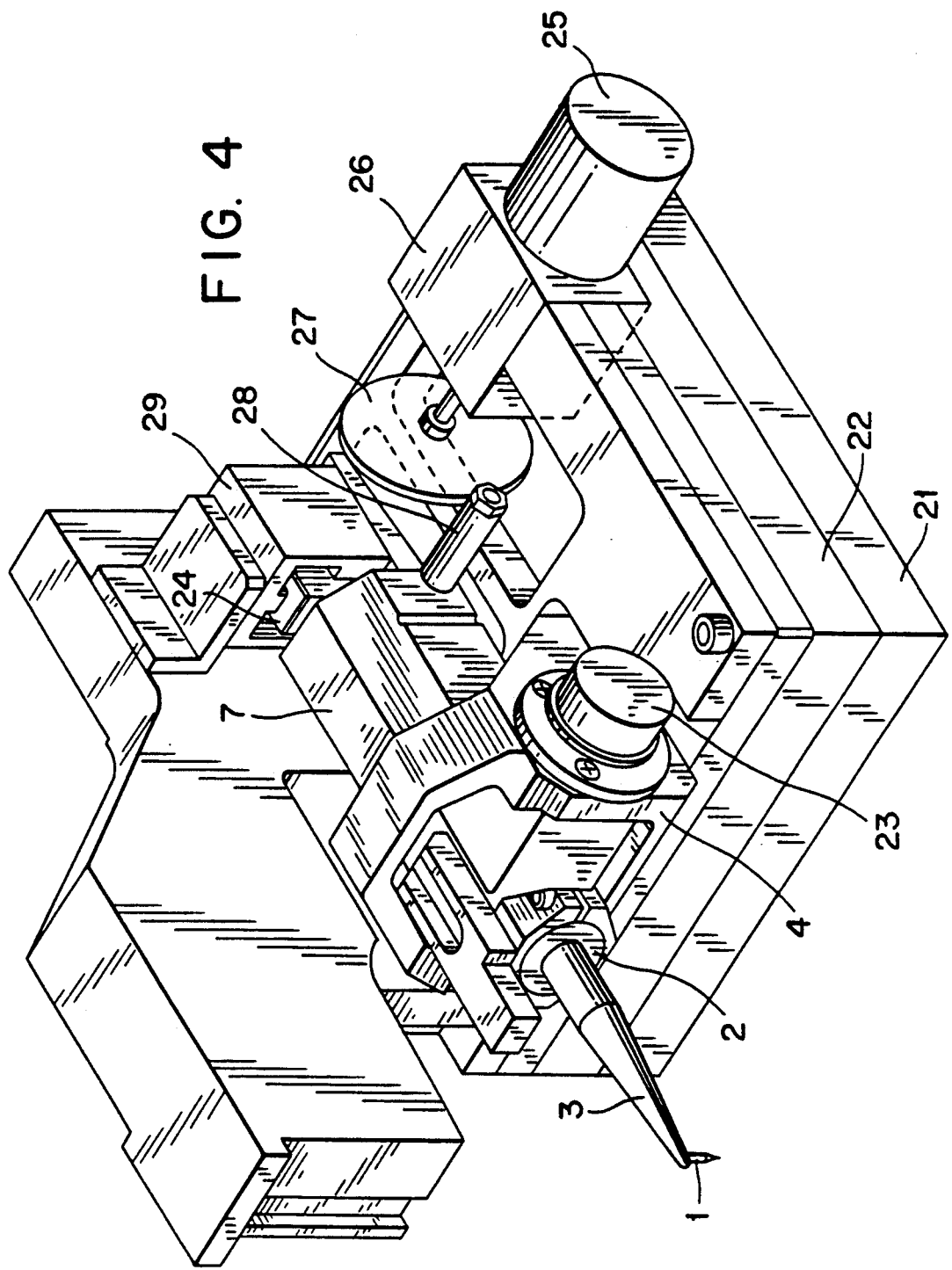

BONDING APPARATUS

BACKGROUND OF THE INVENTION

1. Field of the Invention

The present invention relates to a ultrasonic bonding apparatus for performing bonding of a bonding wire and/or leads of o TAB (Tape Automated Bonding) tape to a semiconductor chip.

2. Description of Related Art

FIG. 1 shows an example of a bonding portion of a conventional ultrasonic wire bonding apparatus with a side view. The bonding portion comprises, at a one end of a horn 11, a capillary 10 having a through-hole 15 formed therein through which a bonding wire passes. A top end of the bonding wire that protrudes downwardly from a lower end opening of the through-hole 15, is wire-bonded to bonding pads of a chip (die) or internal leads of such as a ceramic package, etc. after being shaped into a sphere by an electric spark. A resonator 13 supports, at the other end of the horn 11, an ultrasonic transducer 14 with an oscillation coil. Magnetostrictive material in the transducer 14 oscillates upon a reception of a predetermined oscillation signal from the coil. This oscillation resonates with the horn 11 operating as a resonator 13 to be amplified, so that the capillary 10 vibrates horizontally at high speed.

In such conventional bonding apparatus as mentioned above, in order to vibrate the capillary 10 in a horizontal plane, ultrasonic oscillation is transformed into mechanical vibration. Therefore, the vibration frequency and the vibration waveform of the end portion of the capillary 10 are limited to those at a specific range and cannot be selected arbitrarily.

Further, since the resonance frequency is changed if the top end portion of the capillary 10 contacts with a semiconductor chip or ceramic package, etc., the vibration itself is unstable.

SUMMARY OF THE INVENTION

Therefore, a primary object of the present invention is to provide an ultrasonic bonding apparatus capable of vibrating a capillary stably at an arbitrarily selectable frequency and with an arbitrarily selectable waveform.

According to the present invention, a bonding apparatus is obtained which comprises a capillary fixed at one end of a resonance horn, a piezoelectric element fixed at the other end of the resonance horn and capable of vibrating a capillary upon a piezoelectric element control signal, and a piezoelectric element control signal generator means generating the piezoelectric element control signal. With this construction, since the vibration of the piezoelectric element is not affected by a stress applied to the capillary, the vibration frequency and the vibration waveform of a top end portion of the capillary of the bonding apparatus can be set arbitrarily and stably.

BRIEF DESCRIPTION OF THE DRAWINGS

The above and further objects, features and advantages of the present invention will become more apparent from the following detailed description of embodiments taken in conjunction with the accompanying drawings, wherein:

FIG. 4 is a partial side view of a capillary portion of a third embodiment of a bonding apparatus according to the present invention.

DETAILED DESCRIPTION OF THE PREFERRED EMBODIMENTS

Figure 1:
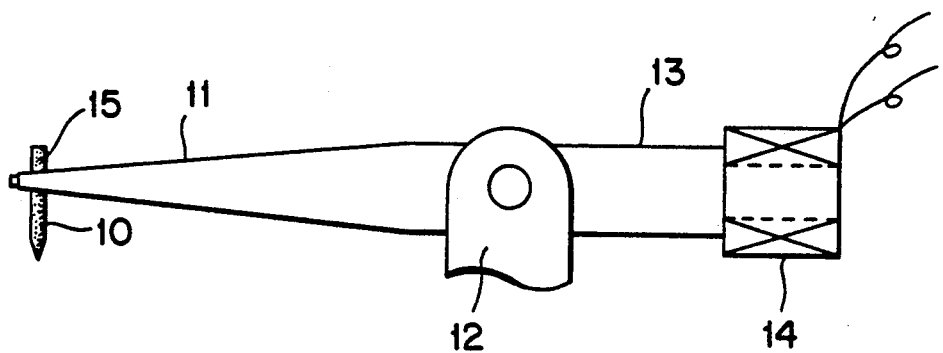
FIG. 1 is a partial side view of a capillary portion of a conventional wire bonding apparatus.
Figure 2:
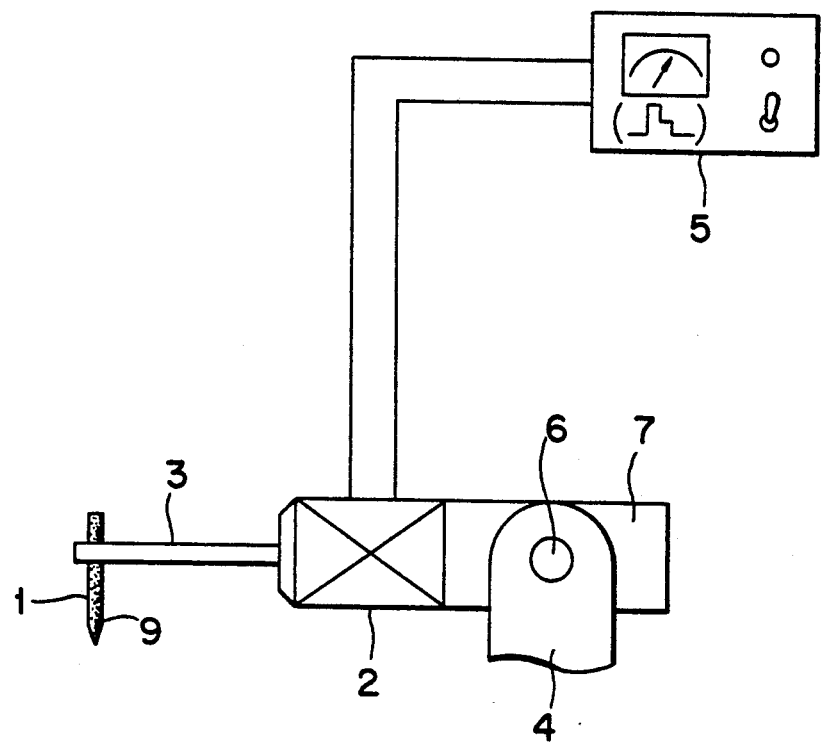
FIG. 2 is a partial side view of a capillary portion of a first embodiment of a bonding apparatus according to the present invention.

FIG. 2 is a partial side view of a vertically arranged bonding functioning portion of a first embodiment of a bonding apparatus according to the present invention. It should be noted that, in order to facilitate understanding of the present invention, the bonding apparatus is illustrated in a simplified form in FIG. 2.

A capillary 1 is fixed at one end of an arm 3 as a wire-bonding tool and is provided with a through-hole 9 to pass a bonding wire therethrough. The through-hole 9 is formed so that a tip of the bonding wire protrudes from a lower end thereof. The tip of the penetrated bonding wire is deformed in a shape of a sphere by melting with a spark due to electric discharge on demand and then bonded to bonding pads on a chip (die) or to internal leads of a ceramic package, etc. A piezoelectric element 2 is supported at the other end of the arm 3 and fixedly secured at the other end thereof to a holding portion 7. The piezoelectric element 2 responds to a piezoelectric element control signal supplied from a piezoelectric element control signal generator 5 to vibrate the capillary 1 horizontally through the arm 3 at a stable and arbitrary frequency and with a stable and arbitrary waveform. The holding portion 7 is supported by a support 4 through a horizontal shaft 6 rotatable through an angle of ±10–30 degrees.

The vibration of the capillary 1 in a horizontal plane through the arm 3 at an arbitrary frequency with a stable and arbitrary waveform is realized by the facts that, since the dimensional vibration of the piezoelectric element 2 is highly dependent on voltage applied thereto and free from the stress applied to the capillary 1, a vibration amount of the capillary 1 can be controlled arbitrarily by the control signal voltage and that, since the piezoelectric element 2 has a high responsiveness to the control signal voltage in the high frequency band, it is easy to generate higher frequency vibration and/or a more special waveform compared with a conventional ultrasonic system. An amount of vibration of 5–10 micron-meters which has been considered necessary for a wire bonding apparatus may be easily produced by a control signal voltage in the order of 30–60 volts with use of a piezoelectric element which is easily obtainable in a market. An example of the piezoelectric element used in the first embodiment is a stack-type one of a plurality of piezoelectric ceramic plates.

In a case of bonding wire to a lead of the TAB tape and to a bonding pad of a chip, the capillary 1 is not necessarily required to have such through-hole 9 therein.

Figure 3:
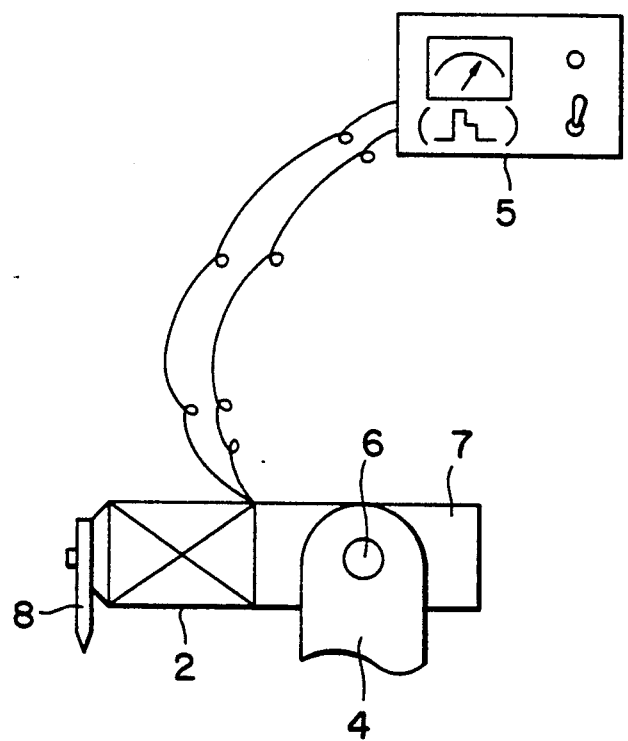
FIG. 3 is a partial side view of a capillary portion of a second embodiment of a bonding apparatus according to the present invention.

FIG. 3 is a cross sectional side view of a portion of a second embodiment of the present bonding apparatus, including a capillary. Since this embodiment is basically the same as that shown in FIG. 2, only different portions thereof will be described.

In the second embodiment in FIG. 3, a capillary 8 is supported directly by one end of a piezoelectric element 2. With this structure, it is possible to transmit vibration of the piezoelectric element 2 directly to the capillary 8, so that vibration of the capillary 8 can be controlled more exactly.

FIG. 4 is a perspective view of a portion of a third embodiment of the present bonding apparatus.

A base portion 22 of a flat metal plate is disposed on an X-Y stage 21 for moving the base portion 22 to control the position of a capillary 1 in X and Y directions. A support portion 4 is provided on the base portion 22 and supports a holder portion 7 swingable vertically by means of a suitable shaft rotatably supported at both ends thereof by bearings 23 by an angle in a range of ±10 to 30 degrees.

The holder portion 7 includes an arm 3 and a piezoelectric element 2 in a front portion thereof and a moving coil 24 in a rear portion thereof. The moving coil 24 is associated with a magnet yoke 29 so that, when the latter attracts the moving coil 24 of the holder portion 7 upwardly, the capillary 1 supported at the top end of the arm 3 is lowered to a predetermined bonding level and, when the moving coil 24 is pulled down by the magnet yoke 29, the capillary 1 is lifted up to a predetermined non-bonding level.

A motor 25, a gear box 26 for regulating rotational speed of the motor 25 and a cam 27 fixedly secured on an output shaft of the gear box 26 are arranged on the base portion 22. The cam 27 stores a vertical movement of the capillary 1 from a position thereof at which it bonds a top end of a bonding wire to a bonding pad of an IC chip to a position at which it bonds another portion of the bonding wire to an internal lead of a ceramic package after leading the bonding wire along a predetermined path. The cam 27 may be exchanged according to bonding conditions. The cam 27 is followed by a cam follower 28 from on a side surface of the holder portion 7.

The capillary 1 for wire bonding functions to pass a bonding wire through a through-hole formed therein so that a tip of the bonding wire protrudes from a lower end of the through hole. After the tip of the bonding wire is deformed into a shape of a sphere by melting the tip portion of the bonding wire with an electric spark, the tip is bonded to bonding pads of a chip (die) or to internal leads of a ceramic package, etc. The piezoelectric element 2 is supported at one end of the arm 3 and fixedly secured, at the other end thereof, to the holder portion 7. The piezoelectric element 2 responds to a piezoelectric element control signal from a piezoelectric element control signal generator (not shown) to vibrate the capillary 1 horizontally through the arm 3 at a stable and arbitrary frequency with a stable and arbitrary waveform. The holder portion 7 is supported by the support portion 4 through the horizontal shaft rotatable through an angle of ±10-30 degrees.

The present invention provides an advantage in that the capillary vibrates stably with a frequency and a waveform which can be set arbitrarily and accurately.

What is claimed is:

1. A bonding apparatus, comprising: a capillary, a piezoelectric element capable of vibration, said capillary being mechanically connected to said piezoelectric element to be driven by said piezoelectric element, and a piezoelectric element control signal generator generating a control signal which is applied to said piezoelectric element to control the vibration thereof, whereby said piezoelectric element vibrates in response to said control signal generated by said piezoelectric element control signal generator and the vibration of said piezoelectric element is transferred to said capillary to cause said capillary to vibrate by the vibration of said piezoelectric element.

2. A bonding apparatus, comprising: a capillary, a piezoelectric element having one end supporting said capillary, a piezoelectric element control signal generator generating a piezoelectric element control signal which is applied to said piezoelectric element to control the vibration thereof, said vibration of said piezoelectric element causing said capillary to vibrate so that the vibration of said capillary is controlled in frequency and waveform by said piezoelectric element control signal.

3. A bonding apparatus, comprising: a capillary, an arm having one end supporting said capillary, a piezoelectric element being supported at the other end of said arm and capable of vibrating said capillary through said arm, and a piezoelectric element control signal generator generating a control signal which is applied to said piezoelectric element to control the vibration of said piezoelectric element, said vibration of said piezoelectric element causing said arm and said capillary to vibrate so that the vibration of said capillary is controlled in frequency and waveform by said control signal.

* * * * *